US006797591B1

(12) United States Patent
Gormley et al.

(10) Patent No.: US 6,797,591 B1
(45) Date of Patent: Sep. 28, 2004

(54) METHOD FOR FORMING A SEMICONDUCTOR DEVICE AND A SEMICONDUCTOR DEVICE FORMED BY THE METHOD

(75) Inventors: Colin Stephen Gormley, Belfast (IE); Stephen Alan Brown, Belfast (IE); Scott Carlton Blackstone, Lee, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/661,766

(22) Filed: Sep. 14, 2000

(51) Int. Cl.$^7$ ............................................... H01L 21/46
(52) U.S. Cl. ..................... 438/455; 438/456; 438/457; 438/458; 438/459; 438/622
(58) Field of Search ..................... 257/254, 528–530, 257/635, 637, 639, 758, 529; 438/50–54, 118, 215, 333, 455–459, 467, 601, 622, 406; 148/DIG. 12, DIG. 135

(56) References Cited

U.S. PATENT DOCUMENTS

| | | | | |
|---|---|---|---|---|
| 3,938,175 A | * | 2/1976 | Jaffe et al. ................... 257/418 |
| 4,614,119 A | | 9/1986 | Zavracky et al. |
| 4,777,826 A | * | 10/1988 | Rud, Jr. et al. ............... 73/708 |
| 4,829,018 A | * | 5/1989 | Wahlstrom ......... 148/DIG. 135 |
| 5,087,585 A | * | 2/1992 | Hayashi ....................... 438/455 |
| 5,366,923 A | * | 11/1994 | Beyer et al. ................ 438/406 |
| 5,480,832 A | * | 1/1996 | Miura et al. ................ 438/404 |
| 5,542,558 A | * | 8/1996 | Benz et al. ..................... 216/2 |
| 5,629,790 A | | 5/1997 | Neukermans et al. |
| 5,760,443 A | | 6/1998 | McCarthy |
| 6,045,625 A | * | 4/2000 | Houston ..................... 438/455 |
| 6,064,081 A | | 5/2000 | Robinson et al. |
| 6,291,858 B1 | * | 9/2001 | Ma et al. ..................... 257/350 |
| 6,326,285 B1 | * | 12/2001 | Behfar et al. ............... 438/455 |
| 6,341,039 B1 | | 1/2002 | Flanders et al. |
| 6,373,632 B1 | | 4/2002 | Flanders |

FOREIGN PATENT DOCUMENTS

| | | |
|---|---|---|
| GB | 2275787 | 9/1994 |
| WO | WO 01/67156 | 9/2001 |
| WO | WO 01/67171 | 9/2001 |

OTHER PUBLICATIONS

"Evaluation of Wafer Bonding and Etch Back for SOI Technology," Baumgart et al. *Philips Journal of Research*. 1995. vol. 49, No. 1/2.
"Micromachined Widely Tunable Vertical Cavity Laser Diodes," Sugihwo et al. *Journal of Microelectromechanical Systems*. Mar. 1998. vol. 7, No. 1.

* cited by examiner

*Primary Examiner*—Eddie Lee
*Assistant Examiner*—Quang Vu
(74) *Attorney, Agent, or Firm*—Gauthier & Connors LLP

(57) ABSTRACT

A method for forming a multi-layer semiconductor device (1) having a lower silicon layer (4), an intermediate silicon layer (5) within which micro-mirrors (10) are formed and an upper spacer layer (6) of silicon for spacing another component from the micro-mirrors (10). First and second etch stop layers (8,9) of oxide act as insulation between the respective layers (4,5,6). In order to minimize damage to the micro-mirrors (10), the formation of the micro-mirrors (10) is left to the end of the forming process. An assembly of the lower layer (4) and the intermediate layer (5) with the first etch stop layer (8) is formed, and the second etch stop layer (9) is then grown and patterned on the intermediate layer (5) for subsequent formation of the micro-mirrors (10). The upper layer (5) is then bonded by an annealing process to the patterned second etch stop layer (9). After the formation of communicating bores (30) in the lower layer (4) and thinning of the first etch stop layer (8) adjacent the micro-mirrors (10) through the communicating bores (30), openings (16) in the upper layer (6) and the micro-mirrors (10) are sequentially formed by reactive ion etching through the upper layer (6). Portions of the first and second etch stop layers (8,9) adjacent the micro-mirrors (10) are then etched away.

39 Claims, 3 Drawing Sheets ical components and micro-opto-electro-mechanical components are commonly required. Such devices are typically multi-layer devices which include multiple layers of semiconductor material and/or other suitable materials. The micro-components are typically formed in one of the semiconductor layers, while circuitry is formed in the other layers, and may also be formed on the micro-component layer. The circuitry may be provided for controlling the micro-components and may also be provided for other functions. In certain cases some or all of the circuitry for controlling the micro-components may be provided on a separate discrete semiconductor device. In general, it is desirable, and indeed in many cases it is a requirement that the respective semiconductor layers should be electrically insulated, one from the other. This requires the formation of insulating layers between the respective semiconductor layers. Such insulating layers, are typically provided by oxide layers, which may be grown or deposited. Because of the number of semiconductor layers, in general, it is necessary to bond some of the layers together by suitable bonding processes, typically, high temperature annealing processes. Typically, a semiconductor layer is bonded to an oxide layer which had been grown or deposited on another semiconductor layer. The surface of the semiconductor layer to be bonded to the oxide layer, in general, is ground and polished to a high degree of smoothness for providing a smooth surface for abutting the oxide layer on the other semiconductor layer. The oxide layer, in general, provides a relatively smooth surface for bonding to the semiconductor layer, however, being an oxide layer some flow of the oxide layer is accommodated during the annealing process in order to achieve a good bond between the respective surfaces.

In general, micro components, in particular, micro-electro-mechanical components and micro-opto-electro-mechanical components are high precision components, and in general, are relatively fragile, and are vulnerable to damage, in particular, distortion and the like if subjected to hostile environments. In particular, such micro-components are vulnerable to damage resulting from high temperature annealing processes. It is therefore desirable that the formation of such micro-components should be one of the last, and preferably, the last set of operation in the formation of the multi-layer semiconductor device. However, in many instances this is not possible, since it is required in many cases that the micro-components be formed in an intermediate layer between others of the semiconductor layers. In such cases, it is necessary that the micro-components to be formed prior to bonding of one of the intermediate layer to an adjacent layer or layers. In such cases, the micro-components are subjected to the high temperatures of the annealing process for bonding the intermediate layer within which the micro-components have already been formed to the adjacent layer. This is undesirable.

There is therefore a need for a method for forming a multi-layer semiconductor device which overcomes these problems.

The present invention is directed towards providing such a method, and a semiconductor device formed according to the method.

METHOD FOR FORMING A SEMICONDUCTOR DEVICE AND A SEMICONDUCTOR DEVICE FORMED BY THE METHOD

FIELD OF THE INVENTION

The present invention relates to a semiconductor device, and a method for forming the semiconductor device. In particular, the invention relates to a method for forming a multi-layer semiconductor device in which at least two of the layers are bonded by an annealing bonding process.

BACKGROUND OF THE INVENTION

As miniaturisation requirements in the semiconductor industry grow, the demand for semiconductor devices with increasing numbers of features similarity grows. In the field of laser and sensor technology semiconductor devices which include micro-electro-mechan

SUMMARY OF THE INVENTION

According to the invention there is provided a method for forming a semiconductor device comprising first, second and third layers, with a component being formed in the second layer, and first and second etch stop layers being located between the first and second layers, and the second and third layers, respectively, and at least the second etch stop layer being bonded to one of the second and third layers, the method comprising the steps of:

prior to bonding the one of the second and third layers to the second etch stop layer, patterning the second etch stop layer to define the component in the second layer for facilitating etching of the second layer through the third layer, bonding the one of the second and third layers to the second etch stop layer, and etching the second layer through the third layer and the second etch stop layer for forming the component in the second layer.

In one embodiment of the invention a portion of the third layer adjacent the component is etched for exposing the component. Preferably, the second layer is etched sequentially after the portion of the third layer adjacent the component has been etched in the same etching process.

Advantageously, the portion of the third layer adjacent the component which is etched for exposing the component is etched to the second etch stop layer. Ideally, the second layer is etched to the first etch stop layer for forming the component.

In one embodiment of the invention a portion of the second etch stop layer adjacent the component and which is exposed by the etched portion of the third layer is etched through the etched portion of the third layer for exposing the component. Advantageously, a portion of the first etch stop layer adjacent the component is etched for forming a void between the component and the first layer after the component has been formed.

In one embodiment of the invention a communicating bore is formed through the first layer communicating with the first etch stop layer for facilitating etching of the portion of the first etch stop layer adjacent the component for forming the void between the component and the first layer. Preferably, prior to etching the second layer for forming the component initially only a part of the portion of the first etch stop layer is etched through the communicating bore in the first layer for thinning the first etch stop layer for minimising stresses induced in the portion of the second layer from which the component is to be formed.

In another embodiment of the invention the first etch stop layer is bonded to one of the first and second layers, and is bonded to the one of the first and second layers prior to the second etch stop layer being bonded to the one of the second and third layers. Preferably, the second etch stop layer is formed on the second layer after bonding of the first etch stop to the respective one of the first and second layers.

In one embodiment of the invention the first and second etch stop layers are grown layers.

Preferably, the second etch stop layer is grown on the second layer, and the second etch stop layer is bonded to the third layer. Advantageously, the first etch stop layer is grown on the first layer, and the first etch stop layer is bonded to the second layer. Ideally, each of the first and second etch stop layers which are bonded to an adjacent one of first, second and third layers are bonded to the adjacent layer by annealing. Preferably, the annealing bonding step is carried out at a temperature in the range of 900° C. to 1,200° C. Advantageously, the annealing bonding step is carried out at a temperature in the order of 1,000° C.

In one embodiment of the invention the first and second etch stop layers are oxide layers.

In another embodiment of the invention the second etch stop layer is patterned by depositing a photoresist layer on the second etch stop layer and exposing and developing a pattern which defines the component on the photoresist layer, and subsequently etching the second etch stop layer is define the component.

In another embodiment of the invention the first, second and third layers are of semiconductor material.

In one embodiment of the invention the first, second and third layers are of silicon material.

In another embodiment of the invention the first, second and third layers are of single crystal silicon.

In one embodiment of the invention the component is a micro-mechanical component.

In another embodiment of the invention the component is a micro-electro-mechanical component.

In a further embodiment of the invention the component is a micro-optical component.

In a still further embodiment of the invention the component is a micro-opto-electro-mechanical component.

In one embodiment of the invention the depth of the first etch stop layer is at least twice the depth of the second etch stop layer.

Additionally, the invention provides a method for forming a semiconductor device comprising at least a first layer and a second layer with a component formed in the second layer, a first etch stop layer being located between the first and second layers, and a second etch stop layer on the second layer such that the second layer is located between the first and second etch stop layers, the first etch stop layer being of depth greater than the second etch stop layer, the method comprising the steps of:

prior to forming the component in the second layer forming a communicating bore through the first layer communicating with the first etch stop layer adjacent a portion of the second layer where the component is to be formed, and etching a part of a portion of the first etch stop layer adjacent the portion of the second layer where the component is to be formed for thinning the first etch stop layer adjacent the portion of the second layer where the component is to be formed to an effective stress relieving depth for relieving stress in the portion of the second layer where the component is to be formed.

In one embodiment of the invention the portion of the first etch stop layer adjacent the component is thinned to a depth relative to the depth of the second etch stop layer for relieving stress in the portion of the second layer where the component is to be formed.

In another embodiment of the invention the portion of the first etch stop layer adjacent the component is thinned to a depth so that the difference in thicknesses of the respective first and second etch stop layers does not exceed 2 microns. Preferably, the portion of the first etch stop layer adjacent the component is thinned to a depth so that the difference in thicknesses of the respective first and second etch stop layers does note exceed 1 micron.

In another embodiment of the invention the depth of the first etch stop layer is at least twice the depth of the second etch stop layer.

Preferably, the first etch stop layer is bonded to one of the first and second layers.

In one embodiment of the invention the first etch stop layer is a grown layer.

In one embodiment of the invention the area in plan view of the portion of the first etch stop layer which is thinned is less than the area in plan view of the component.

Preferably, the area in plan view of the portion of the first etch stop layer which is thinned is at least half the area in plan view of the component.

Advantageously, the area in plan view of the portion of the first etch stop layer which is thinned is at least three-quarters the area in plan view of the component.

In one embodiment of the invention the cross-sectional area of the communicating bore through the first layer is at least half the area of the component in plan view.

In one embodiment of the invention the component is a micro-mechanical component.

Further the invention provides a semiconductor device comprising:

first, second and third layers,
a component formed in the second layer, and
first and second etch stop layers located between the first and second layers, and the second and third layers, respectively, at least the second etch stop layer being bonded to one of the second and third layers, wherein
prior to bonding the second etch stop layer to the one of the second and third layers, the second etch stop layer is patterned to define the component in the second layer for facilitating etching of the second layer through the third layer and the second etch stop layer, and the second layer is etched subsequent to the second etch stop layer having been bonded to the one of the first and second layers.

In one embodiment of the invention a portion of the third layer adjacent the component is etched for forming an opening through the third layer exposing the component.

In another embodiment of the invention a portion of the second etch stop layer adjacent the component is etched for removing the second etch stop from the component.

In a further embodiment of the invention a portion of the first etch stop layer adjacent the component is etched for removing the first etch stop layer from the component and for forming a void between the component and the first layer.

Preferably, the first etch stop layer is etched through a communicating bore formed through the first layer communicating with the first etch stop layer.

In one embodiment of the invention the first and second etch stop layers are oxide layers.

In another embodiment of the invention the first, second and third layers are layers of semiconductor material.

In another embodiment of the invention the first, second and third layers are of silicon material.

In a further embodiment of the invention the component is a micro-mechanical component.

In a still further embodiment of the invention the component is a micro-optical component.

ADVANTAGES OF THE INVENTION

The advantages of the invention are many. A particularly important advantage of the invention is that the method of the invention permits forming of components in the second layer which is located between first and third layers after the layers have been assembled. This would otherwise be difficult, if not impossible. If components were to be formed in the second layer after the three layers had been assembled, without using the method of the invention, it would be necessary to initially etch the first or the third layer to expose the portions of the second layer to be etched for forming the components. The exposed portions of the second layer would then have to be patterned through the first or the third layer, and subsequently etched. Patterning the second layer through a relatively deep first or third layer would be difficult if not impossible. Accordingly, by patterning the second etch stop layer prior to assembling the second and third layers permits the second layer to be readily and easily etched through the third layer and the second etch stop layer, and furthermore, and of particular importance permits accurate etching of the second layer through the third layer and the second etch stop layer. From this advantage many other important advantages follow. For example, since the first, second and third layers of the semiconductor device can be assembled and bonded or otherwise formed together prior to the formation of the component in the second layer, the formation of the component in the second layer can be left to one of the last, if not the actual last set of operations in the formation of the semiconductor device. Thus, once the component has been formed in the second layer the semiconductor device, and in turn, the component is not subjected to any hazardous environment which would otherwise damage the component. Additionally, by virtue of the fact that the formation of the component in the second layer can be left to the last or one of the last set of operations in the formation of the semiconductor device the amount of handling to which the semiconductor device is subjected after the component has been formed is minimised, thus further minimizing any danger of damage being caused to the component.

These advantages are particularly important when the component formed in the second layer is a micro-mechanical component, for example, a micro-electro-mechanical component or a micro-opto-electro-mechanical component. A further advantage of the invention is that circuitry can also be formed in the semiconductor layers for controlling the micro-component in the second layer and for other functions, and the formation of the circuitry can be carried out prior to the formation of the component in the second layer, thus avoiding damage to the component during the circuit forming processes.

The invention will be more clearly understood from the following description of some preferred embodiments thereof which are given by way of example only with reference to the accompanying drawings.

DETAILED DESCRIPTION OF PREFERRED EMBODIMENTS

Referring to the drawings there is illustrated a multi-layer semiconductor device according to the invention indicated generally by the reference numeral 1. In this embodiment of the invention the semiconductor device 1 comprises three semiconductor layers, namely, a first layer, which is a lower 4, a second layer, namely, an intermediate layer 5, and a third layer, namely, an upper layer 6, all of which are of single crystal silicon. The layers 4, 5 and 6 are insulated from each other by respective insulating layers, which also act as etch stop layers, namely, a first etch stop layer 8 which is located between the lower and intermediate layers 4 and 5, and a second etch stop layer 9 which is located between the intermediate and upper layers 5 and 6. The first and second etch stop layers 8 and 9 are both oxide layers which in this embodiment of the invention are grown on their respective adjacent lower and intermediate layers 4 and 5, respectively. The intermediate layer 5 and the upper layer 6 are bonded to the first and second etch stop layers 8 and 9, respectively, by an annealing process as will be described below, and thus, the first and second etch stop layers 8 and 9 are also bondable layers.

Figure 3:
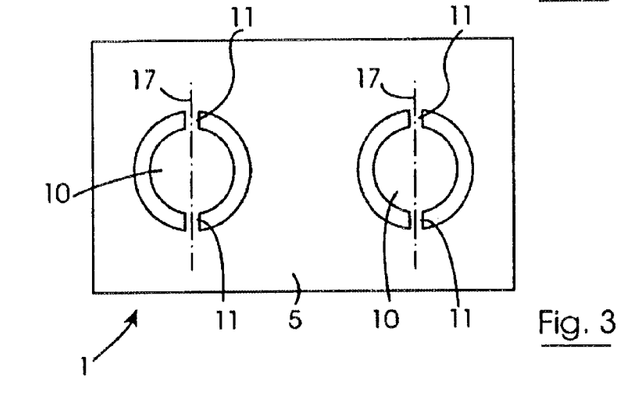
FIG. 3 is a top plan view of the semiconductor device of FIG. 1 on the line III—III of FIG. 2, FIGS. 4 to 7 are front elevational views of the semiconductor device of FIG. 1 in the process of being formed.
Figure 4:
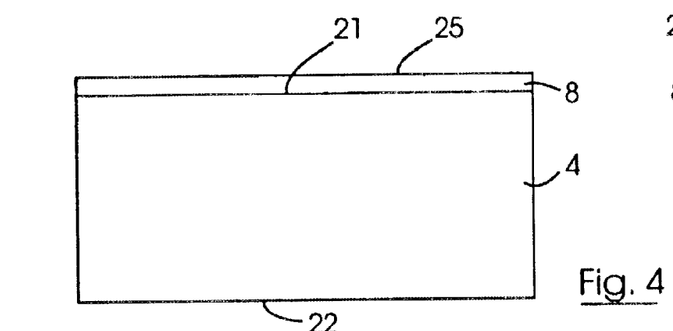
Figure 5:
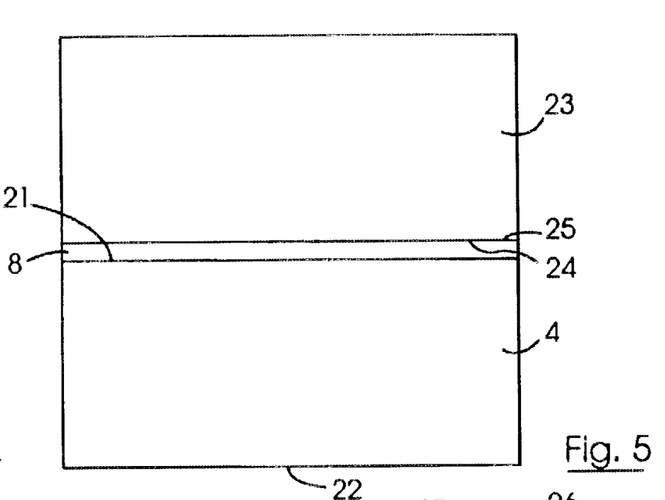

Two components, in this embodiment of the invention micro-opto-electro-mechanical components, namely, circular micro-mirrors 10 are formed in the intermediate layer 5 by etching as will be described below. The micro-mirrors 10 are each connected to the intermediate layer 5 by respective pairs of connecting arms 11 which are etched from the intermediate layer 5 during the etching of the micro-mirrors 10, see FIG. 3. The connecting arms 11 are arranged at 180° intervals around the respective micro-mirrors 10, and are sized and shaped to be resilient and flexible for facilitating displacement of the micro-mirrors 10 relative to the intermediate layer 5 for facilitating directional control and/or filtering of laser light instant on the micro-mirrors 10. This aspect of micro-mirrors 10 will be well known to those skilled in the art. The surfaces of the micro-mirrors 10 which are to be made reflective are coated with an appropriate reflective material, for example, gold or the like. The reflective coating is not illustrated in the drawings, since the provision of the reflective coating does not form part of the invention.

The upper layer 6 forms a spacer layer for spacing other components above the micro-mirrors 10 for acting on light to the micro-mirrors 10. Circular openings 16 are etched through the upper layer 6 as will be described below for accommodating light from such components to the corresponding micro-mirrors 10. The components which may be mounted on the upper layer 6 will not be described further here, since they do not form part of the invention.

In this embodiment of the invention the micro-mirrors 10 may be adapted to be vertically displaceable upwardly and downwardly and/or swivelable about an axis 17 defined by the connecting arms 11. Methods for displacing and swivelling such micro-mirrors will be well known to those skilled in the art.

Referring now in particular to FIGS. 4 to 11, the method for forming the multi-layer semiconductor device 1 will now be described. In the description of the method for the sake of completeness dimensions of the depths of the respective layers will be given, however, it is to be understood that the dimensions given are given solely for the purpose of example, and multi-layer semiconductor devices according to the invention may be formed with layers of any other suitable or desired depth. Indeed it will be appreciated that the depth of the lower layer 4 will largely be determined by the diameter of the wafer on which the semiconductor device is being formed. Additionally, for the purpose of illustration it has not been possible to illustrate the depths of the various layers of the semiconductor device 1 to scale.

Initially, the lower lever 4 of single crystal silicon is prepared with opposite parallel smooth upper and lower surfaces 21 and 22, respectively. The depth of the lower layer 4 to 400 microns. The lower layer 4 acts as a handle layer for the micro-mirrors 10. The first etch stop layer 8 of oxide is thermally grown on the upper surface 21 of the lower layer 4 to a depth of 2 microns, see FIG. 4. The intermediate layer 5 is formed from a layer 23 of single crystal silicon of depth of approximately 400 microns, see FIG. 5. A lower surface 24 of the layer 23 is ground and polished to a high degree of smoothness suitable for bonding to an upper surface 25 of the first etch stop layer 8. The lower surface 24 of the layer 23 and the upper surface 25 of the first etch stop layer 8 are brought together, ensuring no loose particulate matter remaining between the respective surfaces 24 and 25, and are subjected to high temperature annealing at a temperature in the order of 1,000° C. for bonding the respective surface 24 and 25 of the layer 23 and the first etch stop layer 8, respectively.

Figure 6:
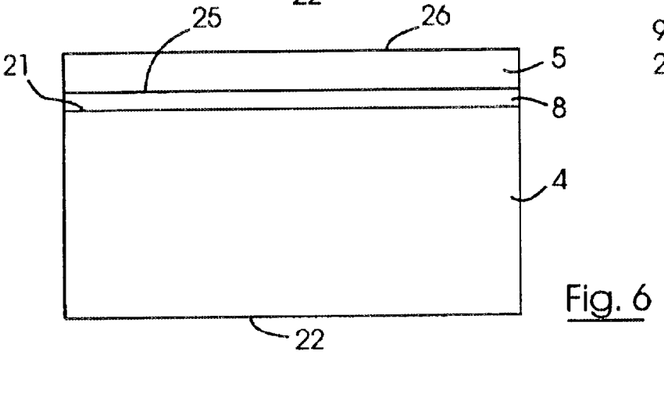
Figure 7:
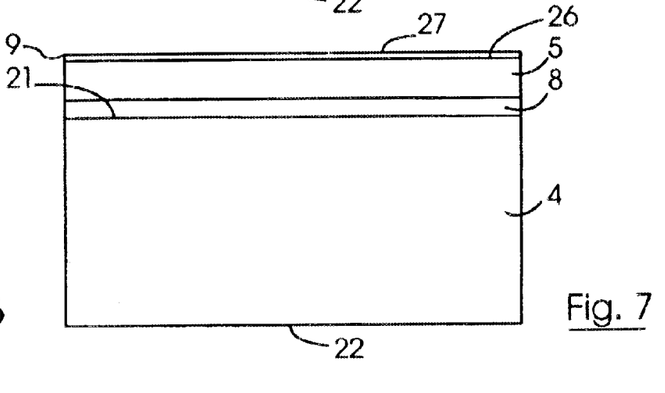
Figure 8:
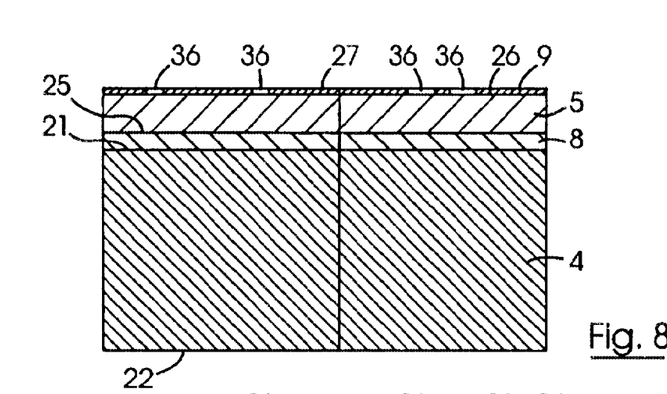
FIGS. 8 to 11 are transverse cross-sectional front elevational views of the semiconductor device of FIG. 1 on the line II—II of FIG. 1 also being formed.
Figure 9:
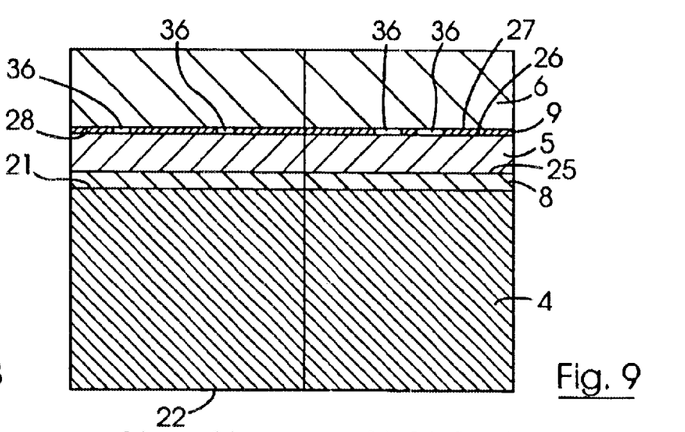

After bonding of the layer 23 to the first etch stop layer 8 has been completed the layer 23 is ground and polished to a depth of approximately 5 microns for forming the intermediate layer 5, see FIG. 6. An upper surface 26 of the intermediate layer 5 which is formed by the grinding and polishing process is polished to a high degree of smoothness, and the second etch stop layer 9 of oxide material is thermally grown to a depth of 0.5 micron on the upper layer 26 of the intermediate layer 5, see FIG. 7. At this stage the second etch stop layer 9 is patterned to define the micro-mirrors 10 and their respective connecting arms 11 for facilitating subsequent etching of the intermediate layer 5 through the second etch stop layer 9 for forming the micro-mirrors 10 and their corresponding connecting arms 11, see FIG. 8. The patterning is carried out by exposing and developing a layer of photoresist (not shown) on an upper surface 27 of the second etch atop layer 9, and subsequently etching the second etch stop layer 9, see FIG. 8.

After the second etch stop layer 9 has been patterned a layer similar to the layer 23 of single crystal silicon of 400 microns is bonded to the upper surface 27 of the patterned second etch stop layer 9 for subsequently forming the upper layer 6. Prior to bonding the layer of single crystal silicon which is to form the upper layer 6, a lower surface 28 is ground and polished for facilitating bonding of the lower surface 26 to the upper surface 27 of the patterned second etch stop layer 9. The respective surfaces 27 and 28 are brought together and bonded by high temperature annealing in similar fashion as already described with reference to the bonding of the layer 23 to the first etch stop layer 8. The layer of silicon which has now been bonded to the patterned second etch stop layer 9 is ground and polished to the desired depth to form the upper layer 6, which in this embodiment of the invention is 40 microns, see FIG. 9.

Figure 1:
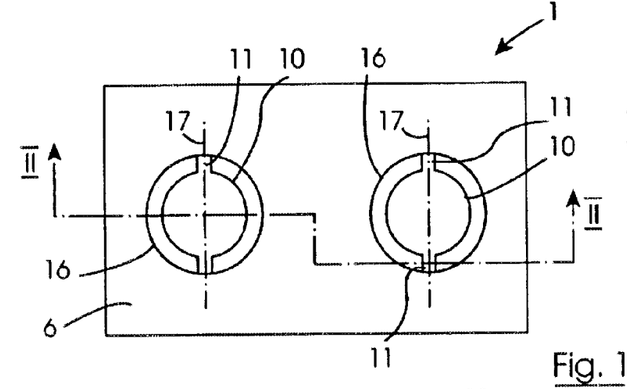
FIG. 1 is a top plan view of a semiconductor device according to the invention.
Figure 2:
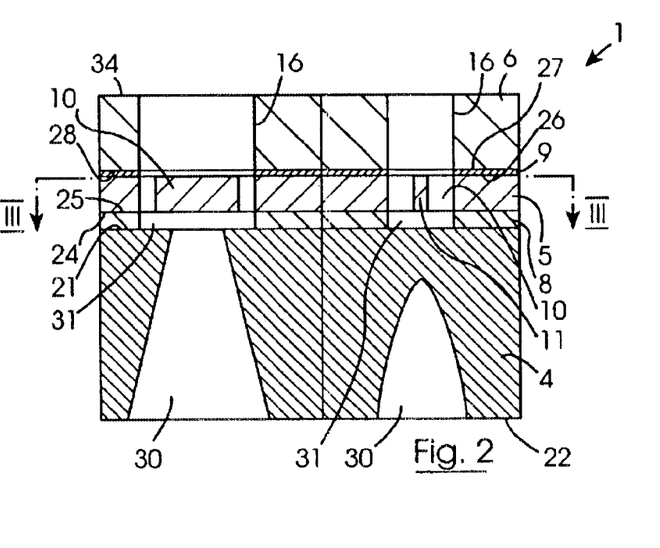
FIG. 2 is a transverse cross-sectional side elevational view of the semiconductor device of FIG. 1 on the line II—II of FIG. 1.
Figure 10:
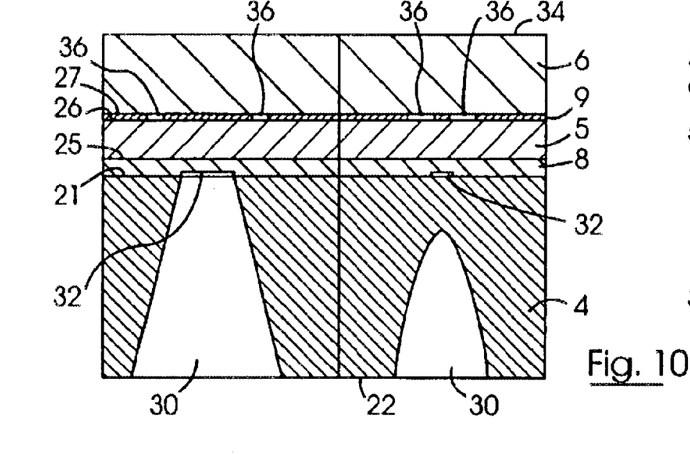
Figure 11:
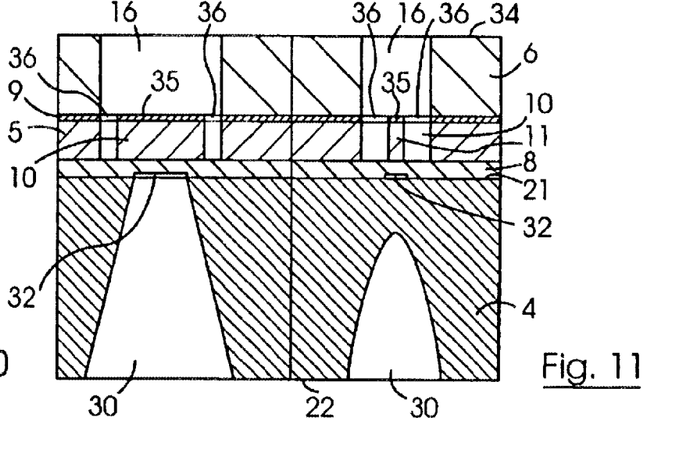

Referring now to FIG. 10 a pair of communicating fusto-conical bores 30 of circular cross-section are next etched through the lower layer 4 to the first etch stop layer 8 by a deep reactive ion etch. The communicating bores 30 are centrally aligned with the corresponding micro-mirrors 10 for facilitating subsequent etching of portions of the first etch stop layer 8 adjacent the micro-mirrors 10 for forming respective voids 31, see FIG. 2, beneath the micro-mirrors 10 for facilitating displacement and/or swivelling of the micro-mirrors 10. The communicating bores 30 are formed by appropriately patterning the lower surface 22 of the lower layer 4, and then etching the lower layer 4 through the pattern.

In this embodiment of the invention as discussed above the first etch stop layer 8 is of 2 microns deep, while the second etch stop layer 9 is of 0.5 micron deep. The first etch stop layer 8 as well as acting as an etch stop layer and an insulator, also acts as a spacer for spacing the intermediate layer 5 and the lower layer 4 apart from each other so that when the voids 31 beneath the micro-mirrors 10 are formed the voids 31 are of sufficient depth for facilitating adequate displacement and/or swivelling of the micro-mirrors 10. However, since the second etch stop layer 9 does not have to act as a spacer, since the upper layer 6 fulfills that functions the second etch stop layer 9 may be significantly thinner than the first etch stop layer 8, and for facilitating efficiency of manufacture of the semiconductor device 1 the second etch stop layer 9 is kept to a minimum thickness, namely, 0.5 micron. However, the provision of oxide layers, and in particular the provision of oxide layers of different depths, on respective opposite sides of a relatively thin film of silicon, as in the case of the micro-mirrors 10 formed in the intermediate layer 5 causes undesirable stresses to be induced in the relatively thin layer of silicon. Accordingly, if the micro-mirrors 10 were etched from the intermediate layer 5 with adjacent portions of the first and second etch stop layers 8 and 9 located on respective opposite sides of the micro-mirrors 10 undesirable stresses would be introduced into the micro-mirrors 10 which could lead to distortion, in particular, bowing of the micro-mirrors 10. In order to avoid this problem prior to etching the micro-mirrors 10 from the intermediate layer 5, portions of the first etch stop layer 6 adjacent the micro-mirrors 10 are thinned through the communicating bores 30. The thinning of the portions of the first etch stop layer 8 adjacent the micro-mirrors 10 is achieved by a light wet oxide etch of the first etch stop layer 8 through the communicating bores 30. The wet oxide etch thins the first etch stop layer 8 to a remaining depth of approximately 1.5 microns adjacent the central portion of the micro-mirrors 10 so that the difference in depths or thicknesses of the respective first and second etch stop layers 8 and 9 does not exceed approximately 1 micron adjacent the central portion of the micro-mirrors 10. The first etch stop layer 8 is thinned by forming voids 32 in the first etch stop layer 8 centrally above the communicating bores 30, see FIG. 10. The avoids 32 are circular in plan view and are of diameter approximately half the diameter of the micro-mirrors 10.

After the portions of the first etch stop layer 8 adjacent the microns-mirrors 10 have been thinned, the assembly is ready for etching the intermediate layer 5 for forming the micro-mirrors 10. This is achieved by initially patterning an upper surface 34 of the upper layer 6 for forming the circular openings 16 by etching. The patterning of the upper surface 34 is carried out by exposing and developing a layer of photoresist (not shown) on the upper surface 34. The assembly is then subjected to a reactive ion etch process or a deep reactive ion etch process depending on the depth of the upper layer 6 for etching the openings 16 through the upper layer 6. When the upper layer 6 has been etched to form the openings 16 portions 35 of the second etch stop layer 9 above the micro-mirrors 10 and the connecting arms 11 act to stop further downward etching. However, openings 35 which have been etched through the second etch stop layer 9 during the earlier patterning process permit the reactive ion etch process to continue down through the intermediate layer 5 to the first etch stop layer 8 for forming the micro-mirrors 10 and their corresponding pairs of connecting arms 11, see FIG. 11. The first etch stop layer 8 prevents further etched etching by the reactive ion etch process once the intermediate layer 5 has been for forming the micro-mirrors 10 and the connecting arms 11, and the reactive ion etch is then terminated.

Thereafter the assembly is subjected to a wet oxide etch for etching the portions 35 of the second oxide layer 9 from the micro-mirrors 10 and the connecting arms 11, and for etching the first etch stop layer 8 for forming the voids 31 beneath the micro-mirrors 10. The wet etch is carried out through the openings 16 in the upper layer 6 and the communicating bores 30 in the lower layer 4. At this stage the assembly is ready for receiving and securing other components to the upper layer 6 above the openings 16.

While the semiconductor device has been described as comprising only two micro-mechanical components which in these embodiments of the invention are micro-opto-electro-mechanical components any number of components may be provided, and in practice, it is envisaged that a matrix of many components may be provided in the device in the intermediate layer. The matrix of components may comprise components which are the same or different. The reason that the semiconductor device has been described as comprising only two such micro-mechanical components has been solely for the purpose of ease of illustration and description.

While the semiconductor device has been described as comprising three semiconductor layers, the semiconductor device may be provided with any number of semiconductor layers from two upwards. Indeed, it is also envisaged that all the layers need not be of semiconductor material. The layers from the which the micro-mechanical components are to be formed may be of any other suitable material, it will of course be appreciated that the semiconductor layers may be of material other than single crystal silicon, for example, polysilicon and the like.

It is also envisaged that the etch stop layers may be formed by processes other than by growing the oxide layers, for example, the oxide layers of the etch stop layer may be deposited. It will also be appreciated that other suitable etch stop layers may be used besides oxide layers.

As discussed above, it will be readily apparent to those skilled in the art that multi-layer semiconductor devices with layers of depth other than those already described may be provided.

It will be appreciated that while the micro-mechanical components have been described as being micro-mirrors, any other micro-mechanical components may be formed in the intermediate layer. For example, any other type of membrane component may be formed in the intermediate layer, such as pressure sensors, other light controlling devices, for example, filters, devices for attenuating light, directing and redirecting light.

It will also of course be appreciated that while the micro-mirrors have been described as being of circular shape, the micro-mirrors may be of any other suitable or desired shape, for example, square, rectangular, triangular, hexagonal, octagonal, or indeed any other polygonal shape. Needless to say, where other components besides micro-mirrors are formed in the intermediate layer, the components may likewise be of any other desired or suitable shape.

What is claimed is:

1. A method for forming a semiconductor device comprising first, second and third layers, with a component being formed in the second layer, and first and second etch stop layers being located between the first and second layers, and the second and third layers, respectively, and at least the second etch stop layer being bonded to one of the second and third layers, the method comprising the steps of:

prior to bonding the second etch stop layer to the one of the second and third layers, patterning the second etch stop layer to define the component in the second layer for facilitating etching of the second layer through the third layer, bonding the second etch stop layer to the one of the second and third layers, and etching the second layer through the third layer and the second etch stop layer for forming the component in the second layer.

2. A method as claimed in claim 1 in which a portion of the third layer adjacent the component is etched for exposing the component.

3. A method as claimed in claim 2 in which the second layer is etched sequentially after the portion of the third layer adjacent the component has been etched in the same etching process.

4. A method as claimed in claim 2 in which the portion of the third layer adjacent the component which is etched for exposing the component is etched to the second etch stop layer.

5. A method as claimed in claim 1 in which the second layer is etched to the first etch stop for forming the component.

6. A method as claimed in claim 2 in which a portion of the second etch stop layer adjacent the component and which is exposed by the etched portion of the third layer is etched through the etched portion of the third layer for exposing the component.

7. A method as claimed in claim 1 in which a portion of the first etch stop layer adjacent the component is etched for forming a void between the component and the first layer after the component has been formed.

8. A method as claimed in claim 7 in which a communicating bore is formed through the first layer communicating with the first etch stop layer for facilitating etching of the portion of the first etch stop layer adjacent the component for forming the void between the component and the first layer.

9. A method as claimed in claim 8 in which prior to etching the second layer for forming the component initially only a part of the portion of the first etch stop layer is etched through the communicating bore in the first layer for reducing the depth of the first etch stop layer for minimizing stresses induced in the portion of the second layer from which the component is to be formed.

10. A method as claimed in claim 1 in which the first etch stop layer is bonded to one of the first and second layers, and is bonded to the one of the first and second layers prior to the second stop layer being bonded to the one of the second and third layers.

11. A method as claimed in claim 10 in which the second etch stop layer is formed on the second layer after bonding of the first etch stop layer to the respective one of the first and second layers.

12. A method as claimed in claim 1 in which the first and second etch stop layers are grown layers.

13. A method as claimed in claim 12 in which the second etch stop layer is grown on the second layer, and the second etch stop layer is bonded to the third layer.

14. A method as claimed in claim 12 in which the first etch stop layer is grown on the first layer, and the first etch stop layer is bonded to the second layer.

15. A method as claimed in claim 1 in which each of the first and second etch stop layers which are bonded to an adjacent one of first, second and third layers are bonded to the adjacent layer by annealing.

16. A method as claimed in claim 15 in which the annealing bonding step is carried out at a temperature in the range of 900° C. to 1,200° C.

17. A method as claimed in claim 16 in which the annealing bonding step is carried out at a temperature in the order of 1,000° C.

18. A method as claimed in claim 1 in which the first and second etch stop layers are oxide layers.

19. A method as claimed in claim 1 in which the second etch stop layer is patterned by depositing a photoresist layer on the second etch stop layer and exposing and developing a pattern which defines the component on the photoresist layer, and subsequently etching the second etch stop layer to define the component.

20. A method as claimed in claim 1 in which the first, second and third layers and of semiconductor material.

21. A method as claimed in claim 1 in which the first, second and third layers are of silicon material.

22. A method as claimed in claim 1 in which the first, second and third layers are of single crystal silicon.

23. A method as claimed in claim 1 in which the component is a micro-mechanical component.

24. A method as claimed in claim 1 in which the component is a micro-electro-mechanical component.

25. A method as claimed in claim 1 in which the component is a micro-optical component.

26. A method as claimed in claim 1 in which the component is a micro-opto-electro-mechanical component.

27. A method as claimed in claim 1 in which the depth of the first etch stop layer is at least twice the depth of the second etch stop layer.

28. A method for forming a semiconductor device comprising at least a first layer and a second layer with a component formed in the second layer, a first etch stop layer being located between the first and second layers, and a second etch stop layer on the second layer such that the second layer is located between the first and second etch stop layers, the first etch stop layer being of depth greater than the second etch stop layer, the method comprising the steps of:

prior to forming the component in the second layer forming a communicating bore through the first layer to the first etch stop layer adjacent a portion of the second layer where the component is to be formed, and etching a part of a portion of the first etch stop layer adjacent the portion of the second layer where the component is to be formed through the communicating bore for reducing the depth of the first etch stop layer adjacent the portion of the second layer where the component is to be formed to an effective stress relieving depth for relieving stress in the portion of the second layer where the component is to be formed.

29. A method as claimed in claim 28 in which the portion of the first etch stop layer adjacent the component is reduced to a depth relative to the depth of the second etch stop layer for relieving stress in the portion of the second layer where the component is to be formed.

30. A method as claimed in claim 28 in which the portion of the first etch stop layer adjacent the component is reduced to a depth so that the difference in thicknesses of the respective first and second etch stop layers does not exceed 2 microns.

31. A method as claimed in claim 28 in which the portion of the first each stop layer adjacent the component is reduced to a depth so that the difference in thicknesses of the respective first and second etch stop layers does not exceed 1 micron.

32. A method as claimed in claim 28 in which the depth of the first etch stop layer is as least twice the depth of the second etch stop layer.

33. A method as claimed in claim 28 in which the first etch stop layer is bonded to one of the first and second layers.

34. A method as claimed in claim 28 in which the first etch stop layer is a grown layer.

35. A method as claimed in claim 28 in which the area in plan view of the portion of the first etch stop layer the depth of which is reduced is less than the area in plan view of the component.

36. A method as claimed in claim 28 in which the area in plan view of the portion of the first etch stop layer the depth of which is reduced is at least half the area in plan view of the component.

37. A method as claimed in claim 28 in which the area in plan view of the portion of the first etch stop layer the depth of which is reduced is at least three-quarters the area in plan view of the component.

38. A method as claimed in claim 28 in which the cross-sectional area of the communicating bore through the first layer is at least half the area of the component in plan view.

39. A method as claimed in claim 28 in which the component is a micro-mechanical component.

* * * * *

UNITED STATES PATENT AND TRADEMARK OFFICE
CERTIFICATE OF CORRECTION

PATENT NO. : 6,797,591 B1  Page 1 of 1
APPLICATION NO. : 09/661766
DATED : September 28, 2004
INVENTOR(S) : Gormley et al.

It is certified that error appears in the above-identified patent and that said Letters Patent is hereby corrected as shown below:

In Column 1, line 18, delete "similarity" and replace with --similarly--

In Column 4, line 10, delete "note" and replace with --not--

In Column 4, line 55, insert the word --layer-- after the word "stop"

In Column 7, line 20 delete "layer 4 to 400 microns. The lower layer 4 acts as a handle" and replace with --layer 4 is 400 microns. The lower layer 4 acts as a handle--

In Column 8, line 27 delete "functions" and replace with --function--

In Column 9, line 8, delete "35" and replace with --36--

In Column 9, line 15, delete "etched"

In Column 9, line 16, insert the word --etched-- after the word "been"

In Column 9, line 45, delete "from the which the micro-mechanical components are to be" and insert, --from which the micro-mechanical components are to be--

In Column 9, line 46, delete "formed may be of any other suitable material, it will of" and replace with --formed may be of any other suitable material. It will of--

Signed and Sealed this

Thirtieth Day of January, 2007

JON W. DUDAS
*Director of the United States Patent and Trademark Office*

UNITED STATES PATENT AND TRADEMARK OFFICE
CERTIFICATE OF CORRECTION

PATENT NO. : 6,797,591 B1  Page 1 of 1
APPLICATION NO. : 09/661766
DATED : September 28, 2004
INVENTOR(S) : Gormley et al.

It is certified that error appears in the above-identified patent and that said Letters Patent is hereby corrected as shown below:

In Column 10, claim 10, line 64, delete "second stop layer being bonded to the one of the second and" and replace with --second etch stop layer being bonded to the one of the second and--

In Column 11, claim 17, line 18, delete "16" and replace with --15--

In Column 11, claim 20, line 30, delete " second and third layers and of semiconductor material." and replace with -- second and third layers are of semiconductor material.--

In Column 12, claim 31, line 23, delete the word "each" and insert the word --etch--

In Column 12, claim 38, line 48 , delete "first layer is at least half the area of the component in plan" and insert --first layer adjacent the component is at least half the area of the component in plan--

Signed and Sealed this

Seventeenth Day of April, 2007

JON W. DUDAS
*Director of the United States Patent and Trademark Office*